United States Patent [19]

Anderson et al.

[11] 4,387,131
[45] * Jun. 7, 1983

[54] CERAMIC DIELECTRICS

[75] Inventors: Leslie C. Anderson, Poughkeepsie; Robert W. Nufer, Hopewell Junction; Frank G. Pugliese, Peekskill, all of N.Y.

[73] Assignee: International Business Machines Corporation, Armonk, N.Y.

[*] Notice: The portion of the term of this patent subsequent to Mar. 21, 1995, has been disclaimed.

[21] Appl. No.: 365,732

[22] Filed: Apr. 5, 1982

Related U.S. Application Data

[60] Continuation of Ser. No. 902,618, May 4, 1978, abandoned, which is a division of Ser. No. 776,815, Mar. 11, 1977, Pat. No. 4,104,345, which is a division of Ser. No. 589,305, Jun. 23, 1975, Pat. No. 4,080,414, which is a continuation-in-part of Ser. No. 158,387, Jun. 30, 1971, abandoned.

[51] Int. Cl.$^3$ .................. B32B 3/00; B32B 5/16; B32B 7/00
[52] U.S. Cl. .................. 428/201; 428/206; 428/210; 428/309.9; 428/318.4; 428/319.1; 428/331; 428/901
[58] Field of Search .................. 264/41–43, 264/61, 63, 79, 86, 299, 44; 428/195, 201, 206, 210, 309.9, 318.4, 319.1, 901, 304.4, 323, 331, 446, 450, 457, 469, 472

[56] References Cited

U.S. PATENT DOCUMENTS 4,080,414  3/1978  Anderson et al. .................. 264/41

Primary Examiner—Bruce H. Hess
Attorney, Agent, or Firm—Henry Powers

[57] ABSTRACT

Production of a sintered ceramic dielectric formed from a green sheet having a uniform microporous structure providing uniform dielectric properties and compressibility for lamination of stacked green sheets into a unitary laminate which may be provided with an internal pattern of electrical conductors extending therein. The structure is obtained by blending the ceramic particulate in a solution of a binder resin miscible in a solvent mixture which is formed from a volatile solvent for the binder resin and a less volatile solvent in which the resin is at most only slightly soluble.

3 Claims, 3 Drawing Figures

CERAMIC DIELECTRICS

This application is a continuation of abandoned copending application Ser. No. 902,618 filed May 4, 1978, which in turn is a division of its copending application Ser. No. 776,815 filed Mar. 11, 1977, now U.S. Pat. No. 4,104,345 granted Aug. 1, 1978, which in turn is a division of its copending application Ser. No. 589,305 filed June 23, 1975, now U.S. Pat. No. 4,080,414 granted Mar. 21, 1978, which in turn is a continuation-in-part of abandoned application Ser. No. 158,387 filed June 30, 1971.

FIELD OF THE INVENTION

This invention relates to the production of ceramic dielectric structures, and more particularly to novel ceramic binder formations for casting of ceramic structures adapted for lamination in a multilayer ceramic circuit structure.

DESCRIPTION OF THE PRIOR ART

In view of the high packing densities attainable with multilevel ceramic circuit structures, they have achieved extensive acceptance in the electronics industry for packaging of semiconductor integrated devices, and other elements, as for example, see U.S. Pat. No. 3,379,943, granted Apr. 23, 1968 to J. G. Breedlove and U.S. Pat. No. 3,502,520, granted Mar. 24, 1970 to B. Schwartz.

In general, ceramic green sheets are prepared from ceramic paints by mixing a ceramic particulate, a thermoplastic polymer and solvents. The paint is then cast or spread into ceramic sheets or slips from which the solvents are subsequently volatilized to provide a coherent and self-supporting flexible ceramic green sheet, which may be finally fired to drive off the resin and sinter the ceramic particulates into a densified ceramic substrate.

In the fabrication of multilevel structures, an electrically conductor forming composition is deposited in a pattern on required ceramic green sheets which form components in the desired multilevel structure. The component green sheets may have via or feed-through holes punched in them, as required in the ultimate structure. The required number of component green sheets are stacked or superimposed in register on each other in the required order. The stack of green sheets is then compressed or compacted at necessary temperature to effect a bond between adjacent layers of the green sheets in the portions between adjacent layers not separated by the electrical conductor forming pattern. Thereafter, the green sheet laminate is then fired to drive off the binders and to sinter the ceramic dielectric structure having the desired pattern of electrical conductors extending internally therein.

It is generally considered essential (as elaborated more fully in U.S. Pat. Nos. 2,966,719 and 3,125,618) that the density of the fired ceramic approach the theoretical possible figure for the raw material (e.g. ceramic particulate) selected; and also that the ceramic product must be non-porous without formation of micropores in order to prevent detrimental effect upon the electrical characteristics thereof. Conversely, the formation of such densified and non-porous fired ceramics was reflected in a necessary comparable void-free densification of the ceramic particulate in green sheets which when sintered provides the desired ceramic product.

Although such densified ceramic green sheets have been found satisfactory for single level ceramic structures, they nevertheless provide serious problems in attempts to laminate them into multilevel structures, particularly where electrically conductor patterns are sandwiched or otherwise incorporated between levels.

As will be evident, a pattern of electrical conductors when coated on a green sheet will be defined in a relief pattern whose top surface is raised relative to the uncoated surface of the green sheet. Thus, in laminating a second superimposed green sheet on a conductor patterned green sheet, it will be necessary to compress the two green sheets together to bring uncoated adjacent portions of the green sheets in contact with one another so that the portions may be bonded to form the desired integrated or unified ceramic laminate or structure.

Although the binder resin characterizes the green ceramic sheet with some degree of pliancy and ductility, as will be evident, any extended flow or extrusion of individual green sheets, in the stack, within their plane under compression will necessarily be attended by distortion elongation and/or possible rupture of any electrical conductor pattern which may be contained between adjacent green sheets in the stack. Accordingly, it is essential that the green sheets employed in the fabrication of a multilayer ceramic must be characterized by dimensional stability within their plane which precludes lateral flow of the green ceramic, if the integrity of the conductor pattern is to be maintained, and to insure registration of the green ceramic laminae of the stack. As a consequence, it is necessary that any distortions of a stack of green sheets under compression be substantially limited in the vertical planes when the uncoated sections of adjacent green sheets are brought into contact for bonding while closely conforming about the conductor pattern to insure complete conductor line enclosure.

Green sheet compositions available heretofore have not been amenable to compressive bonding to each other due to the inherent resiliency of the binder systems employed for the ceramic particulate. In consequence, upon release of compression, the resiliency of the binder system is characterized with an elastic rebound or spring-back frequently accompanied by rupture of the bonded interface between adjacent green sheet laminae in the stack.

Accordingly, it is considered essential that a green ceramic sheet be provided for multilayer structures having lateral dimensional stability with sufficient compressibility to enable a necessary set to permit bonding to each other about an enclosed raised conductor pattern, while maintaining the desired degree of densification consonant with necessary electrical and dielectric characteristics.

SUMMARY OF THE INVENTION

It has been discovered in accordance with this invention that ceramic green sheets adaptable for incorporation into multilayer or multilevel ceramic structures may be formed from cast ceramic slips in which a ceramic particulate is uniformly admixed in a resin binder or system completely solvated in a solvent mixture in which one highly volatile solvent fraction is a completely solvent for the resin binder while a second less volatile solvent fraction provides a maximum solubility of 5 wt. percent for the resin binder (e.g. parts binder resin/100 parts solvent), and which is preferably an asolvent or non-solvent for the resin binder. For purposes of this invention, it is necessary that the ratio of the amount of solvent to the asolvent (in parts by weight) in the solvent mixture, be inverse of their respective evaporation rates ratio to enable the precipation or gelling of the resin binder in a self-supporting structure in the presence of the asolvent.

After casting, the ceramic slip is dried at appropriate temperatures (substantially below the boiling point of the solvent fractions in the solvent mixture) where the more volatile solvent is passed off at a faster rate than the less volatile asolvent. In this manner, as the more volatile solvent is depleted from the ceramic slip, the binder resin or system gels or precipitates in the presence of a substantial amount of the asolvent which is trapped in substantially homogenous dispersion within a self-supporting gelled resin binder matrix. On further drying of the cast ceramic slip, the remaining less volatile asolvent is vaporized by diffusion through the molecular structure of the binder system to leave a uniformly microporous binder matrix, in view of its prior set up on precipitation into a self-supporting structure. The resultant green ceramic sheet is characterized by ceramic particulate uniformly coated with such a microporous binder resin, which enables the controlled vertical compressibility of the green sheets in conjunction with lateral dimensional stability, which may be readily obtained by use of compressive forces sufficient to compact or impart a permanent degree of compression set to the green sheets but insufficient to induce lateral flow or extrusion therein.

In the fabrication of multilayer ceramic structures, sheets of the microporous green ceramic of this invention may be coated with a pattern of an electrical conductor forming composition, with the pattern coated green sheet superimposed on an uncoated surface of a like green ceramic sheet in the desired multilayer stack. The stack is then compacted, under suitable pressures and temperatures, to bring adjacent uncoated portions of the green ceramic sheets together for bonding. The microporous structures of binder in the green ceramic enables sufficient densification in the portions of the sheets sandwiching the conductor pattern, which brings the complementary uncoated portions of the sheets is bonding contact with sufficient conformity with the conductor pattern. After bonding, the integrated green sheets or laminate are fired to drive-off the binder system and sinter the ceramic particulate into a unitized ceramic structure having an electrical conductor pattern extending internally therein. Where via holes have been punched or otherwise formed, in the green ceramic sheets for connection with the conductor pattern; these may be filled in the fired ceramic by capillary flow of a suitable conductor material.

Accordingly, it is an object of this invention to provide novel green ceramic sheets adapted of fabrication of multilayer ceramic structures.

It is another object of this invention to provide novel ceramic slips for use in fabrication of multilayer ceramic structures.

Another object of this invention is the provision of a novel binder resin/solvent formulation forming a supporting matrix of ceramic particulates in a green sheet configuration adapted for forming multilayer ceramic structures.

The foregoing and other objects, features and advantages of this invention will be apparent from the following more particular description of preferred embodiments of the invention, as illustrated in the accompanying drawings.

DESCRIPTION OF THE PREFERRED EMBODIMENTS

Figure 1:
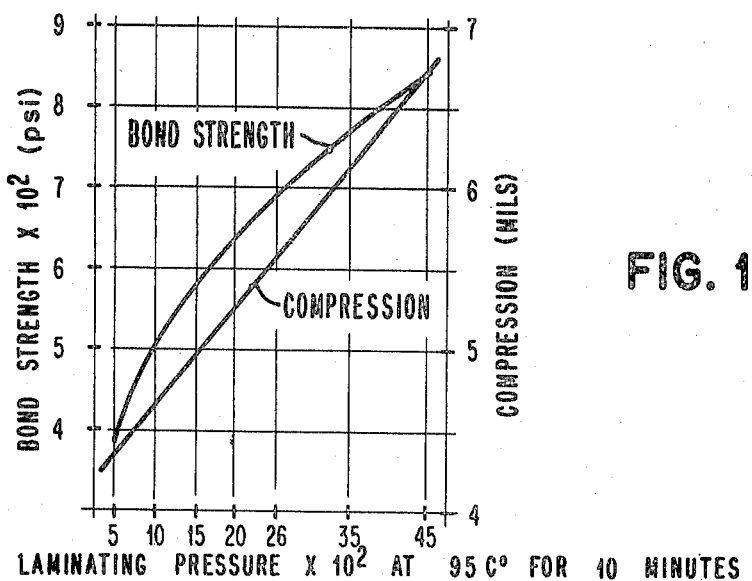
FIGS. 1 to 3 illustrate labeled properties for green ceramic structures obtained in accordance with this invention.

The invention in its broad aspects is in general applicable for use with all conventional ceramic formulations fabricated by usual techniques in which a ceramic paint is cast into ceramic slips which are dried into self-supporting flexible green sheets for ultimate application, in final or fired form, as dielectric supports for printed circuits, insulation, capacitor components, other circuits elements (such as conductive paths, resistors, transistors, diodes, etc.) and the like, either as a single layer or multilayer support. In the fabrication of multilayer ceramics, the necessary green sheets are normally punched with via and register holes, screened with an electronic conductor forming paste, and the required number of green sheets are then stacked in register, laminated to get the multilayer structure and then sintered.

The ceramic paint is normally formulated, in accordance with usual practice, from a ceramic particulate, a binder resin system and a solvent system which as presented in this application is in accordance with this disclosed invention. The function of the binder resin system is to provide adhesive and cohesive forces to hold the ceramic particulate together in its green sheet configuration. The solvent system is of volatile composition whose role is to dissolve the binder resin system into solution, to aid in uniformly mixing the binder resin with the ceramic particulate, and to provide the necessary viscosity to the resultant ceramic paint for subsequent casting. The finely divided, low dielectric ceramic particulate forms the substrate material in the ultimately fired structure.

The ceramic particulate may be selected from the conventional number presently employed in the art, depending on the property desired in the fired ceramic end product. Typical ceramic particulates include alumina steatite, zircon, aluminum silicate, zirconium dioxide, titanium dioxide, magnesium silicate, bismuth stannate, barium titanate, and the like, including combinations thereof. Typically, the ceramic particulate utilized will be finely divided to any typical size conventionally employed, e.g. of the order of minus 300 mesh, in any manner as by pulverization, micromilling and the like; with it being understood that the particle size may be selected in accordance with the properties desired in the fired ceramic.

The binder resin system will normally be comprised of a basic solvent soluble thermoplastic organic polymer having film forming properties which is nonvolatile at moderate temperatures but which will volatilize with other constituents of the resin system on firing of the green ceramic to the final sintered or vitrified state. Typical of the binders comprehended for use in accordance with this invention are those described more fully in the Parks, U.S. Pat. No. 2,966,719.

The binder resin system may contain other additives such as plasticizers and surfactants which are soluble in the solvent mixture and which are volatilized during firing of the green ceramic to its sintered state. The use of a plasticizer imparts flexibility to the polymer film and, in turn, to the green ceramic sheets to maintain it flexible, moldable and workable prior to firing. The surfactants help in wetting of the ceramic particulate by reducing the interfacial tension between the particulate and polymer solution. A wide range of plasticizers and surfactants may be employed in the binder system, and the selection may be made in accordance with techniques well known in the art, as illustrated in the indicated Parks U.S. Pat. No. 2,966,719 wherein, as indicated, it is only necessary that the selected plasticizers and surfactants be compatible with the base polymer of the binder system.

The solvent system or mixture is a volatile fluid whose function is to completely dissolve the binder resin system into a "binder solution" (as will be hereinafter referred) to effect uniform mixing of the binder system with ceramic particulate, and to provide sufficient fluidity to the ceramic paint for subsequent casting into a cohesive slip. In accordance with this invention the solvent system must be comprised of a highly volatile complete solvent fraction for the binder resin and a substantially less volatile asolvent (e.g. non-solvent) fraction in which the binder resin has a maximum solubility of 5 parts per 100 parts asolvent (e.g. 5 wt. percent), and preferably complete insolubility of binder resin in the asolvent fraction so that on volatilization or evaporation of the more volatile solvent fraction, a two phase system of the binder resin and asolvent fraction will be obtained. The volatilities of the solvent and asolvent fractions, of the solvent system, can be readily selected from the evaporation rate constant of the component solvents. Generally, the highly volatile solvent fraction will have an evaporation rate at least twice that of the less volatile asolvent fraction (e.g. an evaporation rate ratio of 2), and preferably the evaporation rate ratios of the solvent fraction to the asolvent fraction will be at least 3. Illustratively, the evaporation rate ratio for methanol to methyl isobutyl ketone will be 3.7. Another essential parameter for the solvent system, employed in accordance with this invention, is the relative proportions of the solvent fraction and the asolvent fraction to insure the development of a two phase resin-binder/asolvent fraction on volatilization of the solvent fraction. Accordingly, it is required that the weight ratio of the amount of the solvent fraction to the asolvent fraction, in the solvent system, be less than the evaporation rate of the solvent fraction to the asolvent fraction. For example, where the evaporation rate ratio of the solvent fraction to the asolvent fraction is 3, the weight ratio of the solvent fraction to the asolvent fraction must be less than 3, or conversely, for every weight unit of the asolvent in the solvent system there must be less than 3 weight units of the more volatile solvent fraction. Similarly, for an evaporation rate ratio of 5 for the solvent fraction to asolvent fraction, there must be less than 5 weight units of the solvent fraction for every weight unit of the less volatile asolvent fraction.

The combined amount of the solvent and asolvent fractions (and conversely the amount of the solvent system) employed in accordance with this invention, will provide, upon evaporation of the solvent fraction, a two phase system in which the remaining asolvent fraction is entrapped within a precipitated and gelled self-supporting matrix of the binder resin. The actual quantities of solvent constituents in the solvent system will normally be the result of conventional consideration providing the necessary viscosity in the ceramic paint to form on casting a cohesive ceramic slip. Generally, this can be obtained by maintaining the ratio, in parts by weight, of the solvent system to the binder resin system in the general range of 1:2 to 1:12, and preferably 1:5 to 1:7, wherein in all cases the weight ratio of the solvent fraction to the asolvent fraction is less than the ratio of the evaporation rate of the solvent fraction to the evaporation rate of the asolvent fraction.

Illustrative of the solvent systems comprehended for the binder resins is a binary solvent incorporating an aliphatic alcohol containing from one to about 6 carbon atoms and an aliphatic ketone containing from about 4 to about 10 carbon atoms. Typical of the aliphatic alcohols for inclusion in a binary solvent system is methanol whose evaporation rate is 610 (relative to n-butylacetate=100) which is advantageously combined, in the binary solvent with a methyl isobutyl ketone (MIBK) typical of the aliphatic ketones and having an evaporation rate of 165 (n-butylacetate=100). This provides an evaporation rate ratio of methanol to MIBK of about 3.7 which, in accordance with this invention, dictates that the weight ratio of methanol to MIBK is less than 3.7. The weight ratio of methanol to MIBK may be as low as 1 to 3, and lower for some binder resin systems. The methanol/MIBK binary solvent is of particular advantage in that the solvent constituents have sufficiently fast evaporation rates to dry a cast ceramic slip rapidly at ambient temperatures.

To prepare the ceramic paint, the ceramic particulate, binder resin and solvent system are thoroughly blended, as in a ball mill, and de-aired so that the ceramic particulates are coated with the binder resin to provide a smooth uniformly dispersed slurry. In general, the desired properties in the green ceramic control the relative proportions of the binder resin and ceramic particulate in the ceramic paint which need only contain sufficient quantities of the solvent system to provide sufficient viscosity which will enable casting the paint into a cohesive ceramic slip. Generally, the green ceramic, upon drying of the slip, will comprise from about 80 to about 95 wt. percent of ceramic particulate and from about 5 to about 20 wt. percent of the binder resin, and preferably the amount of the ceramic particulate should be at least 85 wt. percent of the green sheet, with the remaining being the binder resin of which the plasticizer and wetting agent constitute a relatively small proportion. Normally, the binder resin will comprise from about 0 to about 50 wt. percent plasticizer and from about 0 to about 5 wt. percent wetting agent.

Conversely, the relative proportion or the ceramic particulate to binder resin of the green sheet will be the same in the ceramic paint which will also contain sufficient amount of the solvent system to provide, as indicated above, a slurry of sufficient viscosity to cast a cohesive ceramic slip. The specific quantity of the solvent system in the ceramic paint will normally be that which will provide a Brookfield viscosity in the broad range of about 500 to about 2000 cps., and preferably from about 800 to about 1000 cps.

After blending of the ceramic paint, it is then suitably cast on a removable flexible supporting tape, such as Mylar (a glycol terephthalic acid polyester), Teflon (polytetrafluoroethylene) and the like, on which it may be slightly compressed, spread and leveled by use of a doctor blade to provide drying a green ceramic sheet having a thickness which may be of an order as low as 6.8 to 7.2 mils.

The cast ceramic slip is dried by evaporation of the solvent system at temperatures to provide controlled volatilization in accordance with well known principles in the art, which minimize bubbling, cracking, buckling, volatilization of plasticizer, and the like, of the drying ceramic slip. Normally, the drying temperatures will be sufficiently below the boiling of the solvent fractions of the solvent system to obtain full benefit of the differential in the evaporation rates of the highly volatile solvent and the less volatile asolvent of the solvent system. For example, with a binary solvent system of methanol and methylisobutylketone, drying can be effected at room temperature (e.g. about 23° C.) with the drying times depending on the thickness of the cast ceramic slip, which for slips of 6.8 to 7.2 mls. may be in the range of about 14 minutes to about two hours.

As hereinbefore indicated, by the use of a solvent system in accordance with this invention, there is a unique differentiation in the volatilization of the more volatile solvent fraction and the less volatile asolvent fraction in conjunction with modification of the characteristic of drying ceramic slip. In this respect, as the more volatile solvent fraction evaporates the binder resin is precipitated in a self-supporting matrix while entrapping the remaining less volatile asolvent within its matrix. Studies indicate that as the drying of the cast ceramic continues, the less volatile asolvent fraction is evaporated by diffusion through the binder resin leaving a uniform matrix of micropores therein which permit sufficient compression of the resultant green ceramic without any significant lateral distortion.

For the fabrication of multilayer structures, ceramic green sheet components are shaped and provided, as by mechanically punching, with register and via holes with a metallizing composition screened on required sheet units and via holes in the desired circuit pattern.

The circuit pattern is formed in accordance with conventional techniques by coating, directly on a surface of a green ceramic sheet, a layer of an electrical conductor forming compositions in the pattern desired for electrical conduction. The conductor pattern may be formed on binder suspended metallic compounds convertible by heat to electrically conductive metals, or metallic particles suspended in a heat volatile binder for sintering of the metallic particles by firing at elevated temperatures.

After removal of the supporting tape from the component sheets, they are then stacked in registration with each other, and pressed together under pressures sufficient to bring the uncoated surfaces, of adjacent green sheets, in contact with each other which are then bonded together by hot pressing, by coalescing the binder resin of the stacked green sheets which forms a unitized structure enclosing and supporting the patterns of the conductor forming composition within the structure matrix. During lamination, by hot pressing, the structural modification of the binder resin, in accordance with this invention, enables sufficient compaction or compression of the green sheets to conform about the conductor forming patterns and accommodate for the resiliency of the binder resin which, normally by virtue of elastic return would tend to spring back or recover to their original position, thus tending to separate and rupture the interfacial bonding of the green sheets.

As will be apparent, coating a surface of a green sheet with the conductor forming compositions conversely results in a pattern of raised elevations which act as a spacer which will maintain a separation of the uncoated complementary portions of the sheet and adjacent uncoated portions of a second superimposed green sheet. As a consequence, an initial compression is required in green sheet portions contacting the metallurgy, before the uncoated portions can be pressed together and the binder resin coalesced into the desired bond between the stacked green sheets. The normal tendency of the resilient resin binder to spring back, on release of compressive pressures (particularly at the more compressed portions at the metallurgy) and thus tend to separate and rupture the formed bond in the uncoated portions, is minimized by this invention. The integrity of the bond is maintained by permitting deflation and coalescing of the microporous structure of the binder resin at the metallurgy where the green sheet is accordingly densified to counteract the natural resiliency of the binder resin to spring back in elastic return.

After lamination of the stacked green sheets, the unit is then conventionally fired to burn off the binder resin of the green material and conductor compositions and to sinter the ceramic particulate and develop the conductor patterns, normally of porous structure. After firing, suitable electrically conductive material is then filled in the via holes of the ceramic unit and in the communicating porous capillaries of the metallurgy by capillary flow techniques such as described in co-pending Ahn et al application Ser. No. 850,324 filed Aug. 6, 1969, now U.S. Pat. No. 3,838,204 granted Sept. 24, 1974, and assigned to the assignee of this application.

In accordance with one example of this invention, a uniform ceramic paint was prepared by ball milling together with the following constituents, in parts by weight

| | |
|---|---|
| Ceramic particulate | |
| 95% Alumina (Al$_2$O$_3$ av. particle size 0.5 microns) | 1000 gm |
| Binder resin system | |
| polyvinyl butyral polymer | 91.0 gm |
| dioctyl phthalate plasticizer | 46.5 gm |
| Solvent system | |
| methanol | 155 gm |
| methyl isobutylketone (MIBK) | 465 gm |

The ceramic paint was then filtered, deaerated and cast into a slip on Mylar tape using a doctor blade; dried at room temperature (e.g. 23° C.) in an air flow of 115 ft. 3/min. to form a green ceramic sheet having a thickness between 7.0 and 7.5 mils, and which was 5 inches wide and 60 inches long. The green sheets obtained had the following properties:

| | |
|---|---|
| Specific Gravity 1.52 g/cc | |
| Green Density 2.18 | |
| Deformation Dynamic 0.11 mil/mil of sheet | 2600 psi |
| Static 0.0 mil/mil of sheet | @ 95° C. |
| Bond Strength 482 psi | |
| Permeability 9.0 × 10$^3$ s.p.u. | |

The green sheet was cut into 12 green sheet units of 4 by 4 inches, into which register holes and via holes were punched. A 20 micron thick layer of an electrical conductor forming compositions was then screen coated on selected green sheet units in a pattern desired for electrical conduction. The specific conductor composition employed containing about 84.6 wt. percent of finely divided 4 micron tungsten in a heat volatile organic thermoplastic binder (e.g. terephthalic acid) and sufficient volatile organic solvent (for the binder) 80 percent butyl carbitol acetate and 20 percent ethyl cellulose to provide sufficient fluidity and viscosity to the conductor composition for coating. The solvent was evaporated from the coated composition at 60° C. for 90 minutes. The green sheet units, after removal of the Mylar supporting tape, were then stacked on each other in proper relation, by means of the register holes placed on positioning posts of a press platen. The assembly was then laminated under a pressure of 2600 psi. while heated at 95° C. for ten minutes without any significant volatilization of the binder resin. A final reduction of 7 percent in thickness was noted in the laminate.

After lamination, the unitized green structure was then cut to final shape.

This shaped green laminate was inserted into a firing furnace under a hydrogen atmosphere for burn-off of the binder resin and sintering of the ceramic particulate to form the final ceramic structure. In a typical firing, the furnace temperature was raised to temperature at a rate of 20° C./hr. to 750° C. and 100° C./hrs. above 750° C. Burn-off of the binder resin occurred between 200°–500° C. In the same operation, the furnace reached firing temperature of 1565° C. which was maintained for 3 hours to sinter the ceramic particulate into final fired form.

To show the physical characteristics of the structure formed from the composition of the foregoing example, FIG. 1 illustrates the bond strength and ultimate compression obtained in the green ceramic laminate at indicated pressures of lamination.

Figure 2:
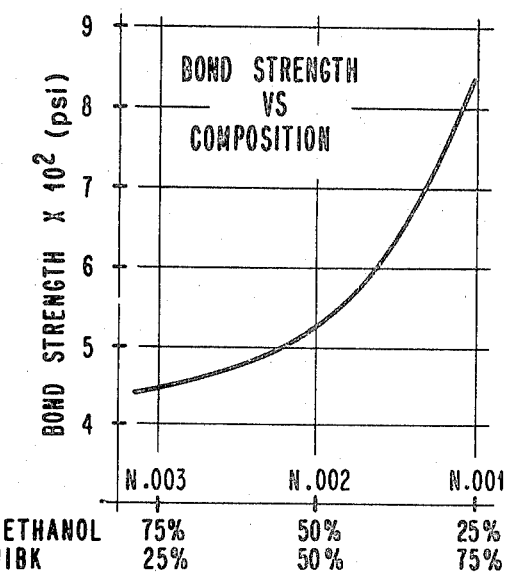

FIG. 2 is presented to illustrate the bond strengths obtained by variation in the proportions of methanol and methylisobutylketone in the indicated amount of solvent system in the ceramic paint composition of the foregoing example.

Figure 3:
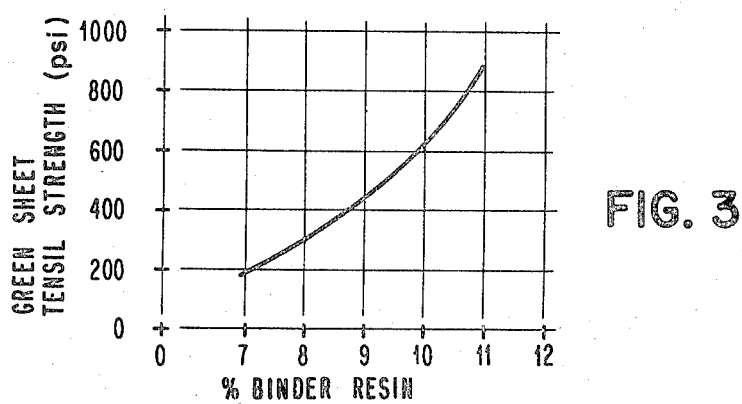

FIG. 3 is presented to illustrate the tensile strength of green sheets obtained by variation in the proportions of binder resin relative to ceramic particulate in the ceramic paint composition of the foregoing example.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A ceramic green sheet structure comprising at least two laminated green sheets comprised of a uniform dispersion of ceramic particles in a microporous thermoplastic binder, and a conductor pattern extending in said structure between said laminated sheets.

2. The structure of claim 1 wherein said particulates comprise alumina.

3. The structure of claim 2 wherein said alumina comprises 8–95 wt.% of the combined weight of said alumina and said binder.

* * * * *